United States Patent [19]

Deutsch et al.

[11] 3,920,455

[45] Nov. 18, 1975

[54] LIGHT-SENSITIVE COMPOSITIONS AND MATERIALS WITH O-NAPHTHOQUINONE DIAZIDE SULFONYL ESTERS

[75] Inventors: Albert S. Deutsch; Joseph M. Poppo, both of Yonkers, N.Y.

[73] Assignee: Polychrome Corporation, Yonkers, N.Y.

[22] Filed: Nov. 7, 1973

[21] Appl. No.: 413,536

Related U.S. Application Data

[62] Division of Ser. No. 148,238, May 28, 1971, Pat. No. 3,823,130.

[52] U.S. Cl..................... 96/75; 96/91 D; 96/115 R; 96/33

[51] Int. Cl.$^2$........................ G03F 7/08; G03C 1/54

[58] Field of Search ..... 96/91 D, 75, 49, 33, 115 R; 260/141

[56] References Cited

UNITED STATES PATENTS

| | | | |
|---|---|---|---|
| 2,767,092 | 10/1956 | Schmidt | 96/91 D |
| 2,772,972 | 12/1956 | Herrick et al. | 96/91 D |
| 3,046,121 | 7/1962 | Schmidt | 96/91 D X |
| 3,130,047 | 4/1964 | Uhlig et al. | 96/91 D X |
| 3,130,048 | 4/1964 | Fritz et al. | 96/91 D X |
| 3,495,979 | 2/1970 | Laridon et al. | 96/91 D X |

FOREIGN PATENTS OR APPLICATIONS

| | | | |
|---|---|---|---|
| 872,154 | 3/1953 | Germany | 96/91 D |
| 922,506 | 1/1955 | Germany | 96/91 D |
| 690,260 | 4/1965 | Italy | 96/91 D |

*Primary Examiner*—Charles L. Bowers, Jr.

[57] ABSTRACT

Light-sensitive compounds and compositions comprising alkyl esters of naphthoquinone diazides that resist hydrolysis during prolonged storage, and sensitized lithographic printing plates made therewith.

10 Claims, No Drawings

LIGHT-SENSITIVE COMPOSITIONS AND MATERIALS WITH O-NAPHTHOQUINONE DIAZIDE SULFONYL ESTERS

This Application is a divisional application of our previously filed application Ser. NO. 148,238, filed May 28, 1971, and now U.S. Pat. No. 3,823,130.

This invention relates to light-sensitive compounds and compositions, and more particularly to light-sensitive compounds and compositions that are especially suitable for the manufacture of positiveacting lithographic printing plates.

In the manufacture of lithographic printing plates, generally a coating of a light-sensitive material is formed on a suitable base, such as a metal, plastic or paper sheet, by applying and drying a solution of the material. The plate is then exposed to light through either a positive or negative image transparency of the object to be reproduced. In the case of a positive plate using a positive transparency, light strikes the light-sensitive material coated on the plate in non-image areas, and the plate is developed by removing the material in such areas. The remaining image areas are ink-receptive and serve to print the desired object.

Numerous compositions have been proposed as light-sensitive materials in the production of positiveacting lithographic printing plates. For example, U.S. Pat. No. 3,046,121 discloses aryl or heterocyclic esters of diazonaphthoquinone sulfonic acids which fade better under the influence of light, resulting in untinted printing plates. U.S. Pat. No. 2,767,092 describes a light-sensitive compound of naphthoquinone-(1,2)-diazide-(2)-5-sulfo-acid-cyclohexyl-ester. In U.S. Pat. No. 3,046,120, light-sensitive layers containing water-insoluble resin-like esters of sulfonic acids of ortho-naphthoquinone-diazides are said to be suitable for producing lithographic plates, and in U.S. Pat. NO. 3,130,047, light-sensitive esters of naphthoquinone-diazide-sulfonic acids with benzene derivatives having at lesat two hydroxyl groups are indicated to be suitable for reproduction layers on printing plates.

Generally, the above-mentioned naphthoquinonediazide light-sensitive compositions are insoluble in water, weak alkalies and weak acids, and are soluble in certain organic solvents. Thus, when a base coated with one of these light-sensitive compositions is exposed to light through an image transparency, the exposed portion of the lithographic plate decomposes, converting the naphthoquinone-diazide into an indene carboxylic acid that is soluble in weak alkaline solutions. A subsequent washing of the surface of the plate with a weak alkaline solution removes the decomposed portion of the coating and leaves the unexposed image area for printing the image.

Presensitized lithographic printing plates, that is, plates coated by a manufacturer, normally are packaged and stored for prolonged periods of time after manufacture and before use by a lithographer. During storage, the plates might be subjected to conditions of high humidity or high temperature, or both. Such conditions are deleterious to the light-sensitive coatings on the plates, particularly certain naphthoquinone-diazide derivatives, because high temperature and humidity cause the ester to hydrolize to form the sulfonic acid of naphthoquinone-diazide and the respective alcohol component. The presence of the sulfonic acid makes the coating soluble in dilute alkaline solutions, thereby impairing the ability of the coating in the unexposed image areas to withstand the alkaline developing solution. Weak and unsharp image printing areas remain. For example, French Pat. No. 904,255 discloses 2-diazo-naphthol-(1)-5-sulfonic acid ethyl ester as a light-sensitive substance in which the development of the exposed layer is effected by means of water. However, U.S. Pat. No. 3,046,121 and the file wrapper of Canadian application Ser. No. 603,664 indicate that such esters do not afford a useable printing plate.

Light-sensitive diazo compounds and compositions therewith have now been discovered that are suitable for use in the manufacture of lithographic printing plates and that resist hydrolysis over prolonged periods of time. These compounds are certain alkyl esters of naphthoquinone diazide, more specifically, esters of naphthoquinone-1,2-diazide-sulfonic acid and an aliphatic or cycloaliphatic alcohol having a total of four to seven carbon atoms and wherein the carbon atom to which the methylol group is attached is branched or is part of a cyclohexyl ring, for example, an alcohol of the formula $$R-CH_2OH$$

wherein R is an alkyl group of 2 to 4 carbon atoms substituted at the alpha-position by methyl or dimethyl or is cyclohexyl, preferably an ethyl group.

The esters of the present invention can be prepared by the condensation reaction of naphthoquinone-1,2-diazide-(2)-5-sulfonic acid or salts thereof, preferably the acid chloride thereof of the formula

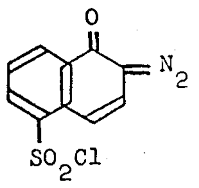

with an alcohol defined above.

Specific alcohols that are suitable for the formation of these esters include cyclohexyl-methyl alcohol, isobutyl alcohol and neopentyl alcohol.

The esters of the present invention can be coated onto a suitable base sheet to form lithographic printing plates. Upon exposure to actinic light, decomposition occurs and the coating can be removed by alkaline developing solutions, leaving clear, sharp and accurate image areas. The light-sensitive coatings do not hydrolyze or lose their alkaline resistance on prolonged storage, and thus are suitable for producing presensitized lithographic printing plates.

A suitable method for preparing a lithographic printing plate is to dissolve the light-sensitive ester in an organic solvent, such as acetone, methyl-ethyl-ketone, methyl-isobutyl-ketone, dimethyl-formamide, methyl Cellosolve, methyl Cellosolve acetate or in mixtures in various proportions thereof, and to apply the solution onto a suitable base sheet, preferably an aluminum sheet. The coating solution should contain at least about 1 part by weight of light-sensitive ester per 100 parts of organic solvent, desirably about 2 to about 20 parts, and preferably about 3 to about 10 parts.

Lithographic printing plates having a longer press life and certain improved properties, such as wear and abrasion resistance, ink-receptivity and adherence, can be prepared by including in the coating along with the light-sensitive ester an alkali-soluble resinous material, in particular alkali-soluble hydroxyaryl-aldehyde resins and styrene-maleic anhydride copolymer resins. Suitable hydroxyaryl-aldehyde resins are phenol-formaldehyde resins available under the trade names of "Alnovol" 429 K from Chemische Werke Albert, Wiesbaden-Biebrich, Germany, and "Bakelite" 2620 from Union Carbide Corporation, and suitable styrene-maleic anhydride copolymer resins are the SMA-1000A series available from Sinclair Oil Corporation. A suitable resin or combination of resins can be mixed with the light-sensitive ester, and the resulting mixture dissolved in the organic solvents described above to form a coating solution. The resin constituent can be used in an amount of up to about ten times by weight the amount of the light-sensitive ester. The resin constituent is desirably used in an amount of at least about 0.1 part by weight per part of ester, and preferably in an amount of about 0.5 to about 5 parts by weight of resin per part of ester.

Coating solutions containing the light-sensitive ester and the alkali-soluble resin should contain at least about one part by weight of the ester-resin mixture per 100 parts by weight of organic solvent, desirably about 2 to about 20 parts by weight and preferably about 4 to 10 parts by weight of the ester-resin mixture per 100 parts by weight of organic solvent.

It is desirable to include in the coating a small amount of indicator to show the image area on the developed plate, for example, a dye that changes color upon light exposure or upon decomposition of the sensitizing ester, thus making it easy to distinguish the image area from the non-image area immediately upon exposure of the plate.

Various light-sensitive coatings were prepared in accordance with the invention and applied to an aluminum metal substrate, exposed to light through a positive image transparency and developed. The following examples illustrate such light-sensitive coatings but are not intended to restrict the scope of the invention.

EXAMPLE 1

Light-sensitive naphthoquinone-1,2-diazide-(2)-5-sulfonic acid cyclohexyl-methyl ester of the formula

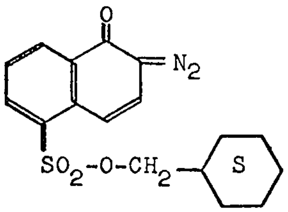

was prepared by dissolving 16 grams of cyclohexyl-methanol and 27 grams of naphthoquinone-1,2-diazide-(2)-5-sulfonyl chloride in 200 ml. of dioxane. 30 ml. of pyridine was added to this solution, which was then stirred at room temperature for 3 hours. The solution was then poured into two liters of water. On standing, an oil was formed that gradually crystallized. The solution was then filtered and washed with water, and the resulting product corresponded to the above formula.

One part by weight of the light-sensitive ester and 2.5 parts of "Alnovol" 429 K phenol-formaldehyde resin were dissolved in 50 parts of a 1 to 1 mixture of methyl Cellosolve acetate and methyl-ethyl-ketone. This solution was whirl-coated onto a grained aluminum metal sheet. The coated metal plate was exposed to a carbon arc light for 3 minutes through a positive image transparency and then developed with a 5% sodium metasilicate solution. A positive image of the transparency remained on the aluminum plate, and sharp, high-quality reproductions of the image were printed in the usual way.

EXAMPLE 2

Light-sensitive naphthoquinone-1,2-diazide-(2)-5-sulfonic acid isobutyl ester of the formula

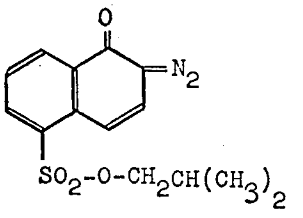

was obtained by condensation of naphthoquinone-1,2-diazide-(2)-5-sulfonyl chloride and isobutyl alcohol according to the procedure described in Example 1.

A solution of one part by weight of the lightsensitive ester, 2,5 parts of Alnovol 429 K and 0.15 part of "Calco Oil Blue A" dye, available from American Cyanamid Corporation, was made up in 50 parts of a 1 to 1 mixture of methyl Cellosolve acetate and methylethylketone. This solution was whirl-coated onto a grained aluminum sheet and exposed to light through a positive image transparency. The lithographic printing plate was developed according to the procedure described in Example 1, and a large number of high quality copies were obtained in the usual manner.

EXAMPLE 3

The light-sensitive condensation product of naphthoquinone-1,2-diazide-(2)-5-sulfonyl chloride and neopentyl-alcohol of the formula

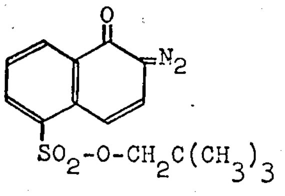

was prepared according to the procedure described in Example 1. A solution was made of 2.5 parts by weight of the above material and 2.5 parts of a phenolformaldehyde resin ("Bakelite" 2620) dissolved in 50 parts of a 1 to 1 mixture of methyl Cellosolve acetate and methyl-ethyl-ketone. A high quality lithographic printing plate was prepared with this solution as described in Example 1.

A 5% by weight solution of the above neopentyl ester in a 1 to 1 mixture of methyl Cellosolve acetate and methyl-ethyl-ketone without any resin was coated onto a grained aluminum plate and exposed to a carbon arc light through a positive image transparency for 3 minutes. The lithographic plate was developed in the manner described, and a positive image was produced that was suitable for high quality lithographic printing.

EXAMPLE 4

The stability of the light-sensitive esters of the present invention toward hydrolysis was demonstrated by coating an aluminum metal plate with a solution of 2.5 parts of the light-sensitive ester together with 2.5 parts of an alkali-soluble resin (Alnovol 429 K) and 0.15 part of Calco Oil Blue A dye. The presensitized metal plate was then stored over a period of three days in a forced-air oven maintained at 60°C. to accelerate the effect of any possible hydrolysis that the light-sensitive ester might undergo. If the light-sensitive ester was unstable and had undergone hydrolysis to form the sulfonic acid and respective alcohol, the blue color of the dye incorporated into the coating changed to a gray color.

Table 1 summarizes the stability of the light-sensitive esters of the invention toward hydrolysis, as compared with the light-sensitive material of naphthoquinone-1,2-diazide-(2)-5-sulfonic acid ethyl ester disclosed in Example 7 of French Pat. No. 904,255, and naphthoquinone-1,2-diazide-(2)-5-sulfonic acid cyclohexyl ester disclosed in U.S. Pat. No. 2,767,092. The light-sensitive esters are listed according to the alcohol component added to the sulfonic acid along with the corresponding color change and notation of stability to hydrolysis.

TABLE 1

Stability of Light-Sensitive Coating Toward Hydrolysis.

Light-Sensitive Material

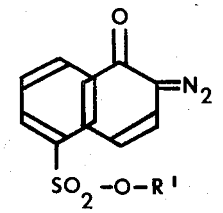

| R' | Color Change At 60°C. | Stability |
|---|---|---|
| 1. $-CH_2CH_3$ | Changed color in less than 1 day | Poor |
| 2. 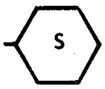 | Changed color in less than 1 day | Poor |
| 3. $-CH_2-$ 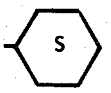 | Slight color change in 2 days | Good |
| 4. $-CH_2CH(CH_3)_2$ | Slight color change in 2 days | Good |
| 5. $-CH_2C(CH_3)_3$ | Trace color change in 3 days | Excellent |

It will be apparent to persons skilled in the art that numerous changes can be made in the conditions, ingredients and proportions set forth in the foregoing examples and tables without departing from the scope of the invention as disclosed hereinabove and as defined in the following claims.

We claim:

1. A light-sensitive composition comprising a mixture of about 0.1 to about 10 parts by weight of an alkali-soluble hydroxyaryl-aldehyde resin, a styrene-maleic anhydride copolymer resin or a mixture thereof, per part by weight of a light-sensitive compound of the formula

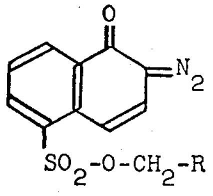

wherein R is cyclohexyl ,$-C(CH_3)_2$, or $-C(CH_3)_3$ carbon atoms substituted at the alpha-position by methyl or dimethyl.

2. A light-sensitive composition as defined in claim 1 wherein said alkali-soluble resin is phenolformaldehyde resin.

3. A light-sensitive composition as defined in claim 1 wherein the mixture contains about 0.5 to about 5 parts by weight of resin per part by weight of said light-sensitive compound.

4. A light-sensitive composition as defined in claim 1 wherein R is cyclohexyl, isopropyl or tert-butyl.

5. A light-sensitive article adapted to be exposed to light and developed to form a lithographic printing plate which comprises a base sheet having a coating thereon of a light-sensitive compound of the formula

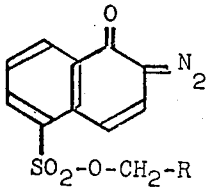

wherein R is cyclohexyl ,$-C(CH_3)_2$, or $-C(CH_3)_3$ atoms substituted at the alpha-position by methyl or dimethyl.

6. An article according to claim 5 wherein said base sheet is aluminum.

7. An article according to claim 5 wherein R is cyclohexyl, isopropyl or tert-butyl.

8. An article according to claim 5 wherein said coating contains about 0.1 to about 10 parts by weight of an alkali-soluble hydroxyaryl-aldehyde resin, a styrene-maleic anhydride copolymer resin or a mixture thereof, per part of said light-sensitive compound.

9. An article according to claim 8 wherein said alkali-soluble resin is phenol-formaldehyde resin.

10. An article according to claim 8 wherein said coating contains about 0.5 to about 5 parts of said alkalisoluble resin.

* * * * *